United States Patent [19]

Sekine et al.

[11] Patent Number: 5,285,066
[45] Date of Patent: Feb. 8, 1994

[54] IMAGING XPS SYSTEM

[75] Inventors: Tetsu Sekine; Minoru Shigematsu; Toyohiko Tazawa, all of Tokyo, Japan

[73] Assignee: Jeol Ltd., Tokyo, Japan

[21] Appl. No.: 908,193

[22] Filed: Jul. 1, 1992

[30] Foreign Application Priority Data

Jul. 2, 1991 [JP] Japan .................................. 1-61575

[51] Int. Cl.$^5$ .............................................. H01J 47/00
[52] U.S. Cl. ..................................... 250/305; 250/397
[58] Field of Search ................. 250/305, 307, 309, 397

[56] References Cited

U.S. PATENT DOCUMENTS

| | | | |
|---|---|---|---|
| 4,584,474 | 4/1986 | Franchy et al. | 250/305 |
| 4,737,639 | 4/1988 | Rusch | 250/397 |
| 4,942,298 | 7/1990 | Comer | 250/305 |
| 5,032,723 | 7/1991 | Kono | 250/305 |
| 5,185,524 | 2/1993 | Page | 250/310 |

OTHER PUBLICATIONS

C. T. Hovland, *Applied Physics Letters,* vol. 30, No. 6, pp. 274–275 (1977).
J. Cazaux, *Ultramicroscopy,* 12, pp. 321–332 (1984).
G. Beamson et al., *J. Phys. E: Sci. Instrum,* vol. 13, pp. 64–66 (1980).
G. Beamson et al., *Nature,* vol. 290, pp. 556–561 (1981).
R. L. Chaney, *Surface and Interface Analysis,* vol. 10, pp. 36–47 (1987).
D. J. Keast et al., *Surface and Interface Analysis,* vol. 3, pp. 99–101 (1981).
K. Yates et al., *Surface and Interface Analysis,* vol. 5, pp. 217–221 (1983).
P. Coxon et al., *Journal of Electron Microscopy and Related Phenomena* 52, pp. 821–836 (1990).
M. P. Seah et al., *Surface and Interface Analysis,* vol. 11, pp. 69–79 (1988).
N. Gurker et al., *Surface and Interface Analysis,* vol. 5, pp. 13–19 (1983).
H. Ebel et al., *Surface Science,* 231, pp. 233–239 (1990).

*Primary Examiner*—Bruce C. Anderson
*Attorney, Agent, or Firm*—Webb, Burden, Ziesenheim & Webb

[57] ABSTRACT

A simple imaging XPS (X-ray photoelectron spectrometry) system using a coaxial spherical sector electron energy analyzer. The system can obtain a two-dimensional photoelectron image of the analyzed sample surface. The energy analyzer (1) includes an input slit (11) extending in the y-direction. An image representing the distribution of the energies of photoelectrons ejected from the sample (S) is focused onto the input slit (11) by an input lens system (5). Only photoelectrons passed through the slit (11) are analyzed by the analyzer (1) and detected by a multichannel detector (12) disposed at least in the y-direction in the focal plane of the analyzer. A pair of deflection plates (10) capable of deflecting the image representing the distribution in the x-direction are mounted within the input lens system (5). Photoelectrons distributed in the y-direction are detected simultaneously by the detector (12). Photoelectrons distributed in the x-direction are successively detected by means of the deflection of the deflection plates (10). Thus, a two-dimensional photoelectron image of the sample is obtained.

1 Claim, 4 Drawing Sheets

IMAGING XPS SYSTEM

FIELD OF THE INVENTION

The present invention relates to an X-ray photoelectron spectrometer and, more particularly, to an imaging XPS (X-ray photoelectron spectrometry) system using a coaxial spherical sector electron energy analyzer capable of producing two-dimensional XPS images of the sample surface under investigation.

BACKGROUND OF THE INVENTION

X-ray photoelectron spectrometry (XPS) which is also known as electron spectroscopy for chemical analysis (ESCA) is a useful tool for providing information about the chemical composition of the elements of solid surfaces and the states of chemical bonding. However, an ordinary XPS instrument can collect average information only from a sample surface area of about 1 cm$^2$.

In recent years, with the development of new materials and failure analysis, it has been required to get information about local sample surface areas and two-dimensional information regarding sample surfaces. Under these circumstances, various contrivances have been made to impart local analysis function or imaging function to XPS instruments. These contrivances are next described briefly.

(a) Method using a scanning electron beam as an X-ray source (C. T. Hovland, *Applied Physics Letters,* Vol. 30, No. 6, pp. 274–275 (1977), and J. Cazaux, *Ultramicroscopy,* 12, pp. 321–332 (1984)): Al or Mg that is used as an X-ray anode is deposited on the rear side of a thin sample. An electron beam is directed to the anode from the side opposite to the sample. At this time, the electron beam is scanned to move the illuminating electron beam spot. X-rays produced at each spot propagate through the anode and impinge on the sample. As a result, photoelectrons are ejected from the sample. The photoelectrons are analyzed by a coaxial cylindrical mirror analyzer (CMA). With this method, an XPS image is obtained at a resolution of about 20 μm.

(b) Method involving projection of a magnetic field (G. Beamson, H. Q. Porter and D. W. Turner, *J. Phys. E: Sci. Instrum.* Vol. 13, pp. 64–66 (1980), and G. Beamson, H. Q. Porter and D. W. Turner, *Nature,* Vol. 290, pp. 556–561 (1981)): This method was developed by Beamson and others in 1980. Photoelectrons trapped in a diverging magnetic field formed by a superconducting magnet move along the magnetic flux and follow a synchrotron orbit. The image of the photoelectrons is magnified and projected onto a screen while the information about the positions at which the photoelectrons are ejected is maintained. A spatial resolution of several microns is achieved.

(c) Method of collecting photoelectrons using a spectral crystal (Robert L. Chaney, *Surface and Interface Analysis,* Vol. 10, pp. 36–47 (1987)): X-rays emitted from an anode are made monochromatic by a spectral crystal and focused onto a sample surface. An illuminated area having a diameter on the order of 100 μm is realized. The local area illuminated with X-rays can be subjected to spectral analysis. Then, the sample stage is scanned by driving the motor to obtain an XPS image.

(d) Method of limiting the field of view (D. J. Keast and K. S. Downing, *Surface and Interface Analysis,* Vol. 3, pp. 99–101 (1981), and K. Yates and R. H. West, *Surface and Interface Analysis,* Vol. 5. pp. 217–221 (1983)): A wide area of a sample surface is uniformly illuminated with X-rays. Photoelectrons are ejected simultaneously from the illuminated area. The input lens of the analyzer is equipped with an aperture that limits the field of view, to detect only the photoelectrons emitted from a local area. This permits spectral analysis of the local area.

(e) Method of magnifying image at plural stages and projecting it, using an intermediate energy analyzer (U.S. Pat. No. 4,758,723 and P. Coxon, J. Krizek, M. Humpherson, and I. R. M. Wardell, *Journal of Electron Microscopy and related Phenomena* 52, pp. 821–836 (1990)): A wide area of a sample surface is uniformly illuminated with X-rays. Photoelectrons are ejected from various locations on the sample surface. From these photoelectrons, a magnified image of the sample is created by a lens system. The magnified image is brought into the front focal point of a lens located before the entrance of a coaxial spherical sector electron energy analyzer. Thus, the electron beam impinging on the analyzer is collimated. The beam is again focused after leaving the analyzer. The resulting image is created by monoenergetic photoelectrons. The XPS image is produced at a resolution of about 10 μm.

(f) Pre-lens scanning system (M. P. Seah and G. C. Smith, *Surface and Interface Analysis,* Vol. 11, pp. 69–79 (1988)): As schematically shown in FIG. 6, a sample surface is uniformly illuminated with X-rays emitted from an X-ray source. Photoelectrons ejected from various locations on the sample surface are analyzed by a system comprising two pairs of deflection plates, a lens, an input aperture, and a coaxial spherical sector electron energy analyzer. A scanning voltage is applied between the two pairs of deflection plates to deflect the incident photoelectrons. Only the photoelectrons ejected from a desired location on the sample surface can be detected. This method enables local analysis of an area about 100 μm in diameter. Also, an XPS image with a spatial resolution of about 100 μm is derived.

We now discuss the methods described above. The method (a) using a scanning electron beam as an X-ray source was attempted in the earliest years. This method was worth noticing only in that it opened up the techniques for local XPS analysis and for imaging XPS systems. However, it is necessary to deposit a sample on the X-ray target surface. Therefore, the sample cannot be analyzed unless it can be deposited. Furthermore, the spatial resolution and the intensities of photoelectrons are affected by the thickness of the deposited film. Hence, it cannot be said that this method is a generally accepted technique.

In principle, the methods (b) and (e) are the best methods of effecting XPS imaging, because photoelectrons ejected from the analyzed area are simultaneously detected, whereby an XPS image can be obtained in a short time. Nonetheless, the method (b) involving projection of a magnetic field needs strong magnetic force as produced by a superconducting magnet. Therefore, complex steps are necessary to fabricate the apparatus, thus increasing the cost. The method (e) necessitates several stages of lenses and so the apparatus is complex. Furthermore, it is difficult to operate the apparatus. Additionally, the apparatus is expensive.

The method (c) of collecting photoelectrons, using a spectral crystal provides good performance in local analysis, but it is necessary to scan the stage in two dimensions, for XPS imaging. This two-dimensional scan takes long times to create an XPS image because the amount of signal is small. The method (d) of limiting the field of view is evaluated essentially as highly as the method (c). However, the method (d) is inferior in intensity to the method (c).

The pre-lens scanning system (f) differs from the methods (c) and (d) in that XPS imaging is enabled without the need to scan the stage. That is, the method (f) is simpler than the methods (c) and (d). However, this method takes a long time to perform, because small amounts of photoelectrons are successively accepted by two-dimensional scan. Further, whenever photoelectrons of other given energy should be obtained, the voltage applied to the pairs of deflection plates must be adjusted so that photoelectrons of the energy of interest pass through the input aperture.

SUMMARY OF THE INVENTION

It is an object of the present invention to provide a novel and simple imaging XPS system which employs a coaxial spherical sector electron energy analyzer and is capable of obtaining a two-dimensional XPS image of a sample surface under investigation in a short time.

The above object is achieved by an imaging XPS (X-ray photoelectron spectrometry) system comprising: a coaxial spherical sector electron energy analyzer having an input slit extending in a direction perpendicular to a radial direction of spherical sector electrodes included in the energy analyzer; an input lens system for focusing an image representing the distribution of the energies of photoelectrons ejected from a sample onto the input slit of the energy analyzer; a detector placed in the focal plane of the energy analyzer which analyzes only photoelectrons passed through the input slit, the detector consisting of a multichannel detector capable of detecting the distribution of the energies of the analyzed photoelectrons at least in a direction perpendicular to a radial direction of the spherical sector electrodes of the energy analyzer; and deflecting means which are disposed between the sample and the input slit and capable of deflecting the image representing the distribution of energies in a direction substantially perpendicular to the longitudinal direction of the input slit, whereby a two-dimensional photoelectron image of the sample is obtained.

In one aspect of the invention, the deflecting means are mounted behind decelerating means included in the input lens system. In this arrangement, the photoelectrons can be deflected irrespective of the analyzed energy and, therefore, the deflection can be controlled easily.

The novel imaging XPS system uses the input slit extending perpendicularly to the radial direction of the spherical sector electrodes of the energy analyzer. The system also employs the multichannel detector capable of detecting the distribution of the energies of photoelectrons at least in a direction perpendicular to the radial direction of the spherical sector electrodes of the analyzer. The deflecting means capable of deflecting an image representing the distribution of energies of photoelectrons ejected from the sample in a direction substantially perpendicular to the longitudinal direction of the input slit is mounted between the sample and the input slit. Consequently, the system is simpler than the instrument in which the sample is scanned with an electric motor and other components. Also, an XPS image can be produced in a shorter time than in the case in which two deflecting means are used to make a scan in two dimensions.

Other objects and features of the invention will become obvious upon an understanding of the illustrative embodiment about to be described or will be indicated in the appended claims, and various advantages not referred to herein will occur to one skilled in the art upon employment of the invention in practice.

DETAILED DESCRIPTION OF THE INVENTION

Figure 3:
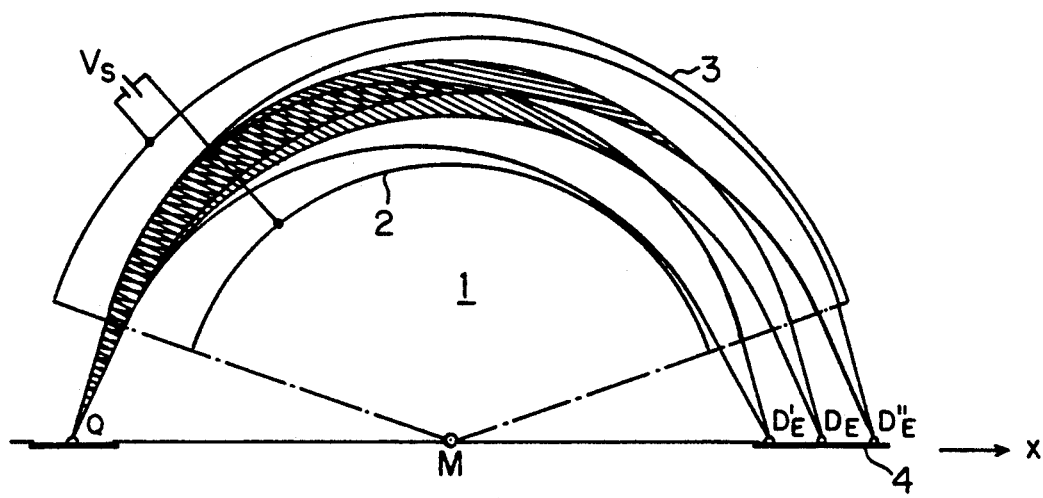
FIG. 3 is a photoelectron orbital diagram illustrating the structure and the operation of a coaxial spherical sector electron energy analyzer incorporated in the system shown in FIGS. 1 and 2.

Before describing the preferred embodiment of the novel imaging XPS system, the characteristics of a coaxial spherical sector electron energy analyzer are discussed. Referring to FIG. 3, a coaxial spherical sector electron energy analyzer is indicated by numeral 1. In this analyzer 1, an inner spherical sector electrode 2 and an outer spherical sector electrode 3 are arranged coaxially about the center M. A voltage is applied between both electrodes. Under this condition, an electron beam traveling substantially circumferentially is passed between the electrodes 2 and 3. The incident electrons are dispersed radially according to their energies at a position that is on the opposite side of the center M from the input position. More specifically, photoelectrons possessing a given energy start from a light source Q, pass between both electrodes, and are focused at a location $D_E$ being located on the opposite side of the center M from the light source Q. Electrons having a higher energy are focused at an outer location $DE''$. Electrons of a lower energy are focused at an inner location $D_E'$. A slit is provided on the focal plane to pass only electrons of a given energy. Then, the passed electrons are detected by a detector 4. In this way, energy discrimination can be carried out. Where a multichannel detector spreading radially is mounted on the focal plane instead of the detector 4, the electrons can be detected at a higher efficiency.

Figure 4A:
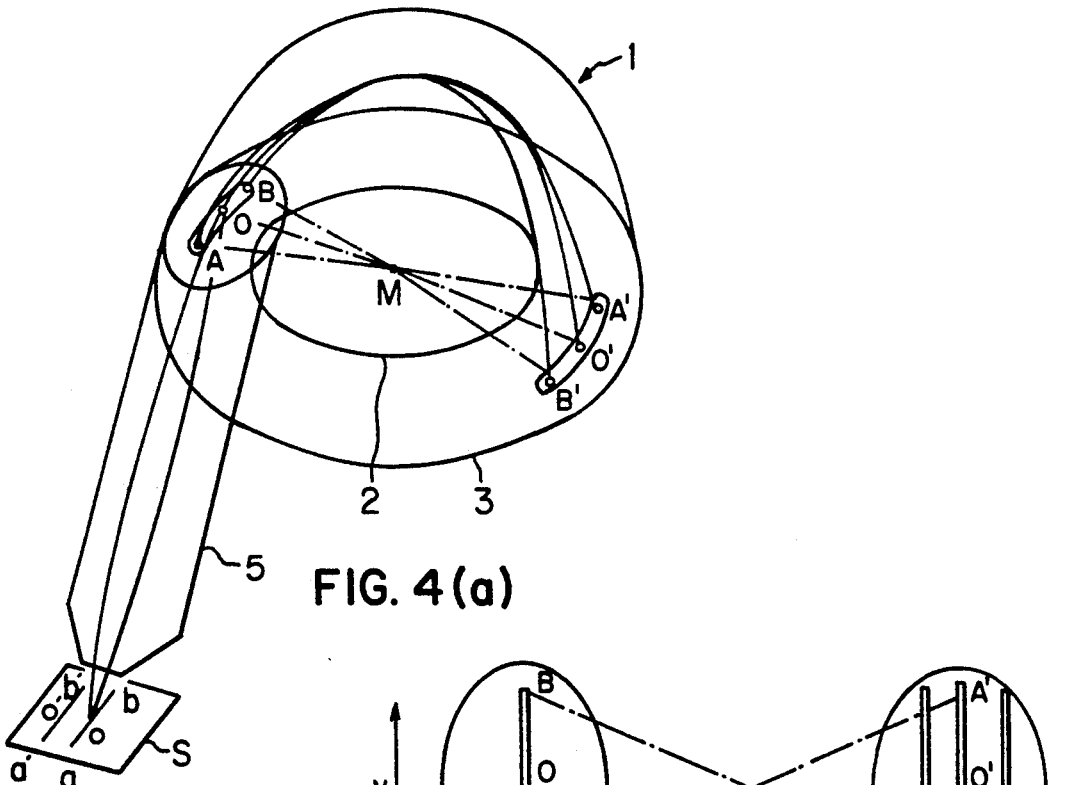
FIG. 4(a) is a photoelectron orbital diagram illustrating the nature of the coaxial spherical sector electron energy analyzer shown in FIG. 3.

Gurker and others have found another property of this coaxial spherical sector electron energy analyzer 1 (N. Gurker, M F. Ebel, and H. Ebel, *Surface and Interface Analysis*, Vol. 5, pp. 13–19 (1983)). In particular, when the light source Q moves in the y-direction perpendicular to the plane of the sheet, the focal point on the focal plane moves also perpendicularly to the plane of the sheet but in the opposite sense (−y). This characteristic is illustrated in FIGS. 4, (a) and (b). In FIG. 4(a), a photoelectron image from a line containing points a, o, and b on the surface of a sample S is focused as an image AOB on the input plane of the energy analyzer 1 by the input lens system 5. The image AOB lies in the y-direction and is orthogonal to the radial direction, x, that starts from the center M. Photoelectrons emanating from the point A are focused at a point A' by the analyzer 1. Photoelectrons originating from the point O are focused at a point O'. Photoelectrons emerging from the point B are focused at a point B'. That is, the relative positional relations among the information sources are maintained in the y-direction.

Figure 4B:
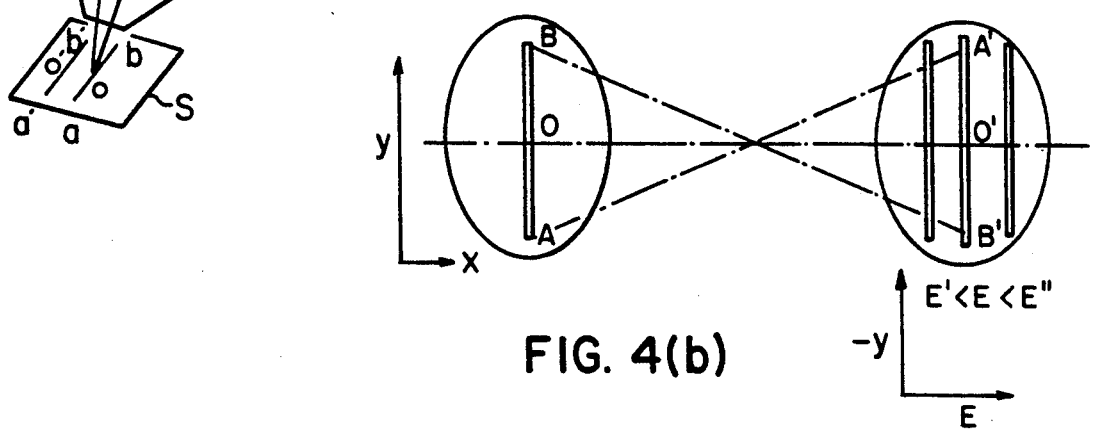
FIG. 4(b) is a diagram illustrating the nature of the analyzer shown in FIG. 3.
Figure 6:
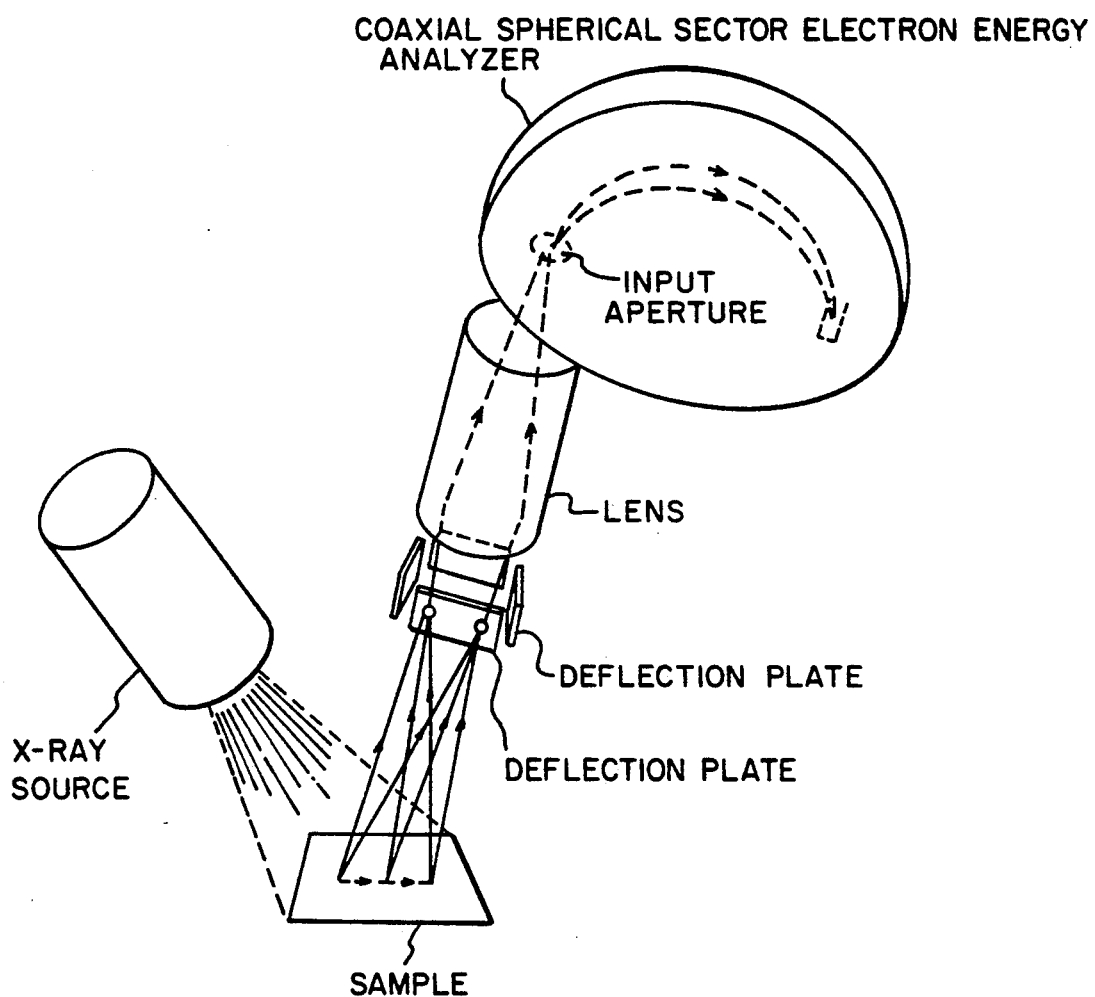
FIG. 6 is a schematic perspective view of a conventional imaging XPS system.

As described already in connection with FIG. 3, with respect to the x-direction in the focal plane, the focal point of the photoelectrons is affected by the energy. Let E be the energy. As shown in FIG. 4(b), a (y - E) image is created on the focal plane.

In order to create a monoenergetic XPS image of the surface of the sample S, a slit containing the points A', O', and B' is positioned on the focal plane. Information about the photoelectrons on the line containing the points a, o, and b on the surface of the sample S is collected. Then, the sample S is slightly moved in the x-direction perpendicular to the line segment aob. At this new position, information about the photoelectrons on the line containing the points a', o', and b' is collected. These and similar operations are successively performed to create an XPS image of the sample S. This method is described by H. Ebel, M. F. Ebel, M. Mantler, G. Barnegg-Golwig, R. Svagera, and N. Gurker, *Surface Science*, 231, pp. 233-239 (1990).

In accordance with the present invention, as shown in FIG. 4(a), deflection plates for deflecting photoelectrons in the x-direction are preferably mounted inside the input lens system 5 instead of translating the sample S. The image formed on the input slit is moved in a stepwise fashion in the x-direction. Only the photoelectrons passed through the slit which is mounted on the input slit plane and extends in the y-direction are analyzed by the coaxial spherical sector electron energy analyzer 1. As described already, with respect to the y-direction, the (y - E) image projected onto the surface of the sample S in a 1:1 relation is detected by the multichannel detector. An XPS image is created from the output signal from the detector which represents the distribution of the energies of photoelectrons of a given energy.

Figure 1:
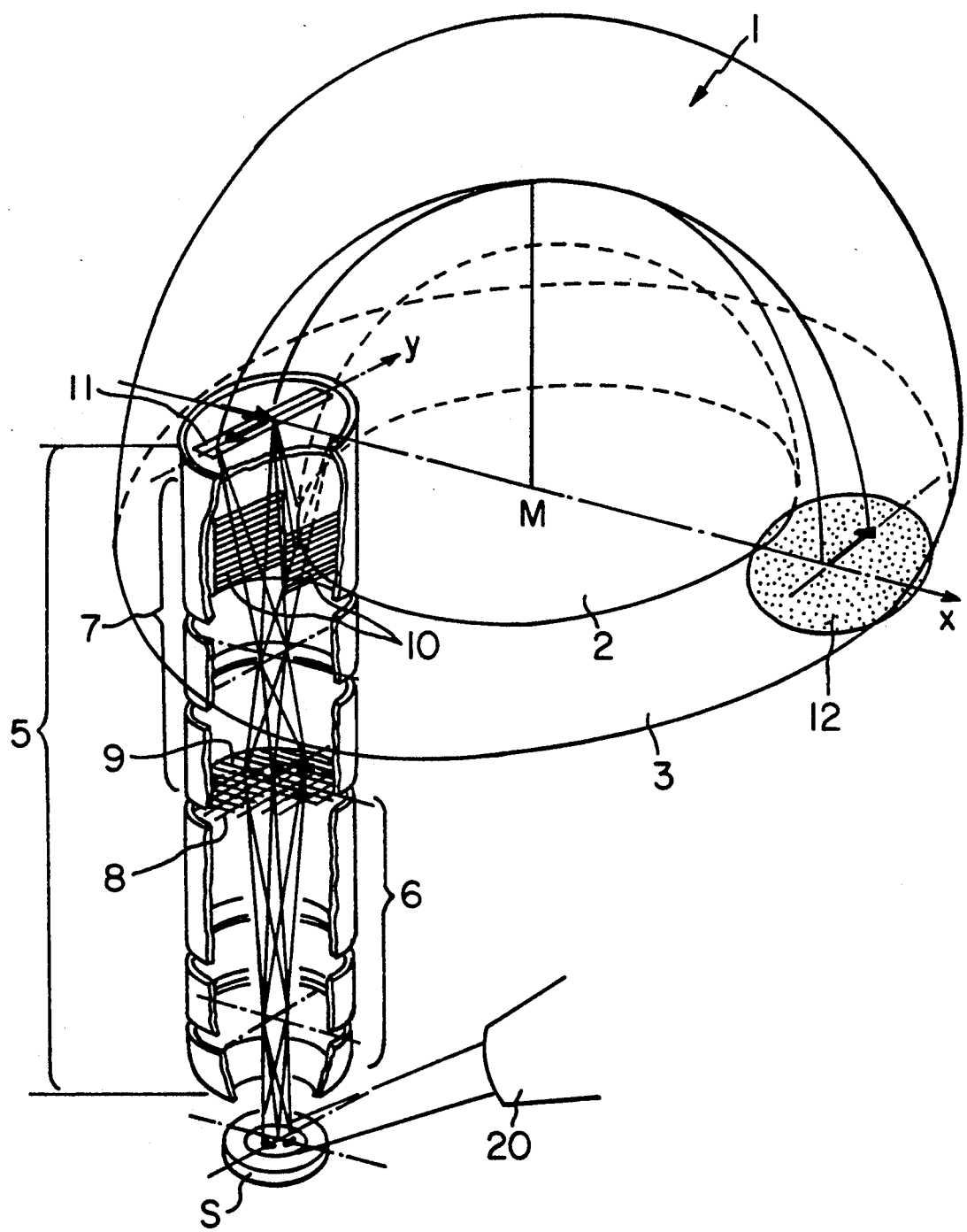
FIG. 1 is a perspective view of an imaging XPS system according to the invention.
Figures 2, 5:
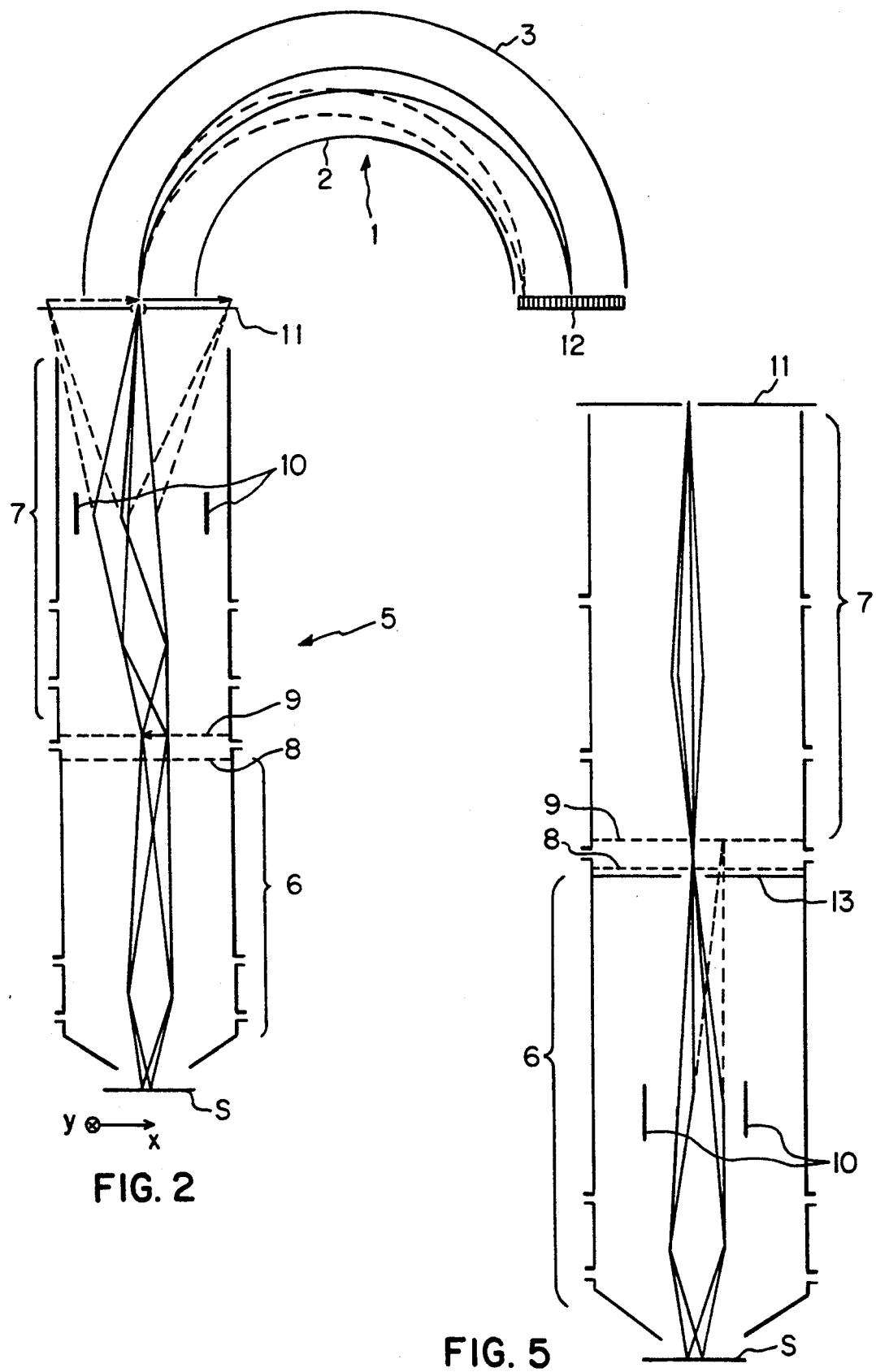
FIG. 2 is a cross-sectional view of the system shown in FIG. 1.
FIG. 5 is a cross-sectional view of the input lens system of a modification of the imaging XPS system shown in FIGS. 1 and 2.

One embodiment of the novel imaging XPS system is next described in detail by referring to FIGS. 1 and 2. This system comprises an input lens system 5, an input slit 11, a coaxial spherical sector electron energy analyzer 1, and a multichannel detector 12, and includes an X-ray source 20 which uniformly illuminates a sample S. Also, control circuits (not shown) are included in the XPS system. The input lens system 5 comprises a first stage of lens 6 consisting of an einzel lens, a second stage of lens 7, two pieces of decelerating mesh 8 and 9 which are located between the lenses 6 and 7. A pair of deflection plates 10 are mounted inside the second stage of lens 7. The coaxial spherical sector electron energy analyzer 1 comprises an inner spherical sector electrode 2 and an outer spherical sector electrode 3 which are mounted coaxially about the center M. A voltage is applied between these electrodes 2 and 3.

Photoelectrons which are ejected from the surface of the sample S illuminated by the X-ray source 20 pass through the first stage of lens 6 and then create a magnified image on the decelerating mesh 9. The energies of the photoelectrons remain the same before and after the first stage of lens 6, but the electrons are decelerated by a required amount between the two pieces of mesh 8 and 9. The photoelectron image of the sample S on the mesh 9 is further magnified by the second stage of lens 7 and forms a magnified image on the plane of the input slit 11. The energies of the photoelectrons remain the same before and after the second stage of lens 7.

The input slit is perpendicular to the radial direction x which extends from the center M of the coaxial spherical sector electron energy analyzer 1. As shown, the slit 11 extends in the y-direction. Only the photoelectrons passed through the slit 11 are analyzed by the analyzer 1. On the principle described above, a (y - E) image as shown in FIG. 4(b) is created on the multichannel detector 12 that is placed on the focal plane of the energy analyzer 1. The deflection plates 10 deflect the electron beam in the x-direction through an angle corresponding to the voltage applied between the deflection plates. As an example, if the voltage applied between them increases linearly from a negative value to a positive value, then the image created on the input slit 11 shifts in the x-direction. Thus, an image concerning successive strip areas which are regularly spaced perpendicularly to the y-axis on the sample surface is created. Therefore, information about the strip areas spaced equally at right angles to the y-axis is collected by the multichannel detector 12, the slip areas being located at a given position in the radial direction, or x-direction. The information corresponds to the voltage applied between the deflection plates 10. This kind of information is herein referred to as the line information. The collection of the line information is repeated with slightly different values of the voltage applied between the deflection plates 10. As a result, a two-dimensional distribution of the energies of photoelectrons can be obtained.

In this system, the stage carrying the sample S is not required to be mechanically scanned. This in turn dispenses with a motor and a motor driver. XPS imaging can be effected in a short time. Since every piece of information in the y-direction is detected simultaneously, it is only necessary to scan the stage in the x-direction.

It is not always necessary that the pair of deflection plates 10 be located within the second stage of lens. FIG. 5 is a cross-sectional view of the input lens system of one modification, where the deflection plates 10 are mounted within the first stage of lens 6. In this case, when the analyzed energy of photoelectrons is varied, the range of voltages applied between the deflection plates 10 must be varied accordingly so that photoelectrons of the desired energy may pass through an intermediate slit 13. However, this modification yields the same advantages as the embodiment described previously.

While the preferred embodiment of the invention has been described, the invention is not limited thereto but rather various changes and modifications are possible. In the above embodiment, the deflection plates 10 are mounted within the input lens system. The plates 10 may also be mounted between the sample and the input lens system.

As described thus far, the novel imaging XPS system uses an input slit extending perpendicularly to a radial direction of the spherical sector electrodes of an energy analyzer. The system also employs a multichannel detector capable of detecting the distribution of the energies of photoelectrons at least in a direction perpendicular to the radial direction of the spherical sector electrodes of the analyzer. Deflecting means capable of deflecting an image representing the distribution of the energies of photoelectrons ejected from the sample in a direction substantially perpendicular to the longitudinal direction of the input slit is mounted between the sample and the input slit. Consequently, the system is simpler than the apparatus in which the sample is scanned with an electric motor and other components. Also, an XPS image can be produced in a shorter time than in the case in which two deflecting means are used to make a scan in two dimensions.

Where the deflecting means are mounted behind the decelerating means of the input lens system, it is not necessary to vary the deflection angle of the deflecting means if the analyzed energy of photoelectrons is changed.

Having thus described our invention with the detail and particularity required by the Patent Laws, what is claimed to be protected by Letters Patent is set forth in the following claims.

What is claimed is:

1. An imaging XPS (X-ray photoelectron spectrometry) system comprising:

means to irradiate a sample to eject photoelectrons having a distribution of energies;

a coaxial spherical sector electron energy analyzer having an input slit extending in a direction perpendicular to a radial direction of spherical sector electrodes included in the energy analyzer;

an input lens system including means for decelerating the photoelectrons ejected from the sample and for focusing an image representing the distribution of the energies of photoelectrons ejected from a sample onto the input slit of the energy analyzer;

a detector placed in the focal plane of the energy analyzer which analyzes only photoelectrons passed through the input slit, the detector consisting of a multichannel detector capable of detecting the distribution of the analyzed photoelectrons at least in a direction perpendicular to a radial direction of the spherical sector electrodes of the energy analyzer; and deflecting means disposed between the sample and the input slit and mounted behind the decelerating means incorporated in the input lens system, said deflecting means being capable of deflecting the image representing the distribution of the energies of photoelectrons in a direction substantially perpendicular to the longitudinal direction of the input slit, whereby a two-dimensional photoelectron image of the sample is obtained.

* * * * *